(12) United States Patent
Fukuda (10) Patent No.: US 11,502,666 B2
(45) Date of Patent: Nov. 15, 2022

(54) ELASTIC WAVE DEVICE

(71) Applicant: Murata Manufacturing Co., Ltd., Nagaokakyo (JP)

(72) Inventor: Daisuke Fukuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1023 days.

(21) Appl. No.: 16/202,382

(22) Filed: Nov. 28, 2018

(65) Prior Publication Data

US 2019/0190484 A1 Jun. 20, 2019

(30) Foreign Application Priority Data

Dec. 19, 2017 (JP) .............................. JP2017-243232
Oct. 3, 2018 (JP) .............................. JP2018-187860

(51) Int. Cl.
*H03H 9/02* (2006.01)
*H03H 9/10* (2006.01)
(Continued)

(52) U.S. Cl.
CPC .......... *H03H 9/02897* (2013.01); *H03H 3/08* (2013.01); *H03H 9/02551* (2013.01);
(Continued)

(58) Field of Classification Search
CPC ........... H03H 9/02897; H03H 9/02551; H03H 9/02559; H03H 3/08; H03H 9/1092; H03H 9/145; H03H 9/25; H01L 41/0477
(Continued)

(56) References Cited

U.S. PATENT DOCUMENTS

2006/0192462 A1 8/2006 Iwamoto et al.
2007/0075606 A1* 4/2007 Inoue ...................... H03H 3/08
310/313 R
(Continued)

FOREIGN PATENT DOCUMENTS

JP 2004-119985 A 4/2004
JP 2008-182292 A 8/2008
(Continued)

OTHER PUBLICATIONS

Official Communication issued in corresponding Japanese Patent Application No. 2018-187860, dated Feb. 24, 2021.
(Continued)

*Primary Examiner* — Derek J Rosenau
(74) *Attorney, Agent, or Firm* — Keating & Bennett, LLP (57) ABSTRACT

An elastic wave device includes a substrate, an IDT electrode, a spacer layer, a cover, and a protective layer. The spacer layer is provided on the substrate and surrounds the IDT electrode. The cover is provided on the spacer layer, is spaced apart from the IDT electrode, and includes a first main surface adjacent to the spacer layer and a second main surface facing the first main surface. The protective layer includes a third main surface contacting the second main surface, a fourth main surface facing the third main surface, and a side surface connected to the fourth main surface. In at least portion of the side surface of the protective layer, a portion including an intersection line between the side surface and the fourth main surface is located farther inward than an outer edge of the substrate in plan view in the thickness direction of the substrate.

19 Claims, 6 Drawing Sheets (51) Int. Cl.
   *H03H 3/08*     (2006.01)
   *H03H 9/145*    (2006.01)
   *H03H 9/25*     (2006.01)
   *H03H 9/64*     (2006.01)
   *H03H 9/05*     (2006.01)
   *H01L 41/047*   (2006.01)

(52) U.S. Cl.
   CPC .... *H03H 9/02559* (2013.01); *H03H 9/02984* (2013.01); *H03H 9/059* (2013.01); *H03H 9/1092* (2013.01); *H03H 9/145* (2013.01); *H03H 9/25* (2013.01); *H03H 9/6489* (2013.01); *H01L 41/0477* (2013.01)

(58) Field of Classification Search
   USPC ...... 310/313 R, 313 A, 313 B, 313 C, 313 D
   See application file for complete search history.

(56) References Cited

U.S. PATENT DOCUMENTS

| | | | |
|---|---|---|---|
| 2008/0174207 A1 | 7/2008 | Tsuda et al. | |
| 2014/0159544 A1* | 6/2014 | Abe | H03H 9/1092 |
| | | | 277/628 |
| 2016/0190423 A1* | 6/2016 | Tsubokawa | H03H 9/1071 |
| | | | 29/25.35 |
| 2016/0380611 A1* | 12/2016 | Kai | H03H 9/02984 |
| | | | 310/313 B |
| 2017/0288123 A1 | 10/2017 | Hatano et al. | |

FOREIGN PATENT DOCUMENTS

| | | |
|---|---|---|
| JP | 2010-278972 A | 12/2010 |
| JP | 2012-119928 A | 6/2012 |
| JP | 2016-066989 A | 4/2016 |
| JP | 2016-123020 A | 7/2016 |
| KR | 10-2006-0095958 A | 9/2006 |

OTHER PUBLICATIONS

Official Communication issued in corresponding Korean Patent Application No. 10-2018-0148303, dated Oct. 28, 2019.

* cited by examiner

ELASTIC WAVE DEVICE

CROSS REFERENCE TO RELATED APPLICATIONS

This application claims the benefit of priority to Japanese Patent Application No. 2017-243232 filed on Dec. 19, 2017 and Japanese Patent Application No. 2018-187860 filed on Oct. 3, 2018. The entire contents of these applications are hereby incorporated herein by reference.

BACKGROUND OF THE INVENTION

1. Field of the Invention

The present invention generally relates to elastic wave devices, and particularly relates to elastic wave devices used in resonators or filters.

2. Description of the Related Art

Heretofore, elastic wave devices used in resonators or filters are known (for example, refer to Japanese Unexamined Patent Application Publication No. 2010-278972).

The elastic wave device disclosed in Japanese Unexamined Patent Application Publication No. 2010-278972 includes a piezoelectric substrate, a vibration section including an IDT electrode, a support layer (spacer layer), a cover layer (cover), and a protective layer. The IDT electrode is formed on the piezoelectric substrate in the elastic wave device disclosed in Japanese Unexamined Patent Application Publication No. 2010-278972. In addition, in the elastic wave device disclosed in Japanese Unexamined Patent Application Publication No. 2010-278972, the support layer is formed in a frame shape around the periphery of the vibration section, the cover layer is arranged on the support layer, and the protective layer is formed on the cover layer.

When mounting the elastic wave device of the related art disclosed in Japanese Unexamined Patent Application Publication No. 2010-278972 on a mounting substrate, the mounting substrate may be tilted with respect to the elastic wave device. In such a case, with the elastic wave device of the related art disclosed in Japanese Unexamined Patent Application Publication No. 2010-278972, a corner portion of the protective layer of the elastic wave device may collide with the mounting substrate. In other words, a corner of the elastic wave device may hit the mounting substrate. Therefore, there is a problem in that cracks may be generated in the protective layer or the mounting substrate.

SUMMARY OF THE INVENTION

Preferred embodiments of the present invention provide elastic wave devices each capable of reducing the likelihood of cracks being generated.

An elastic wave device according to a preferred embodiment of the present invention includes a substrate, an IDT electrode, a spacer layer, a cover, and a protective layer. The substrate has a piezoelectric property in at least a portion thereof. The IDT electrode is provided on the substrate. The spacer layer is provided on the substrate and surrounds the IDT electrode. The cover is provided on the spacer layer and is spaced apart from the IDT electrode. The cover includes a first main surface that is adjacent to the spacer layer and a second main surface that faces the first main surface. The protective layer is provided on the cover and includes a third main surface that contacts the second main surface, a fourth main surface that faces the third main surface, and a side surface that is connected to the fourth main surface. In at least a portion of the side surface of the protective layer, a portion that includes an intersection line between the side surface and the fourth main surface is located farther inward than an outer edge of the substrate in a plan view in a thickness direction of the substrate.

Elastic wave devices according to preferred embodiments of the present invention are capable of reducing the likelihood of cracks being generated.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4F are step diagrams illustrating a preferred embodiment of a method of manufacturing an elastic wave device.

FIGS. 5A to 5E are step diagrams illustrating a preferred embodiment of a method of manufacturing an elastic wave device according to a preferred embodiment of the present invention.

DETAILED DESCRIPTION OF THE PREFERRED EMBODIMENTS

Hereafter, elastic wave devices according to preferred embodiments of the present invention will be described while referring to the drawings.

FIGS. 1 to 3, FIGS. 4A to 4F, FIGS. 5A to 5E, and FIG. 6 described in the following preferred embodiments and so on are schematic drawings and the ratios between the sizes, thicknesses, and so forth of the individual elements in the drawings do not necessarily reflect the actual dimensional ratios. In addition, FIG. 1 is a sectional view taken along X1-X1 in FIG. 2.

First Preferred Embodiment

First, the overall configuration of the elastic wave device according to the first preferred embodiment will be described while referring to the drawings.

Figure 1:
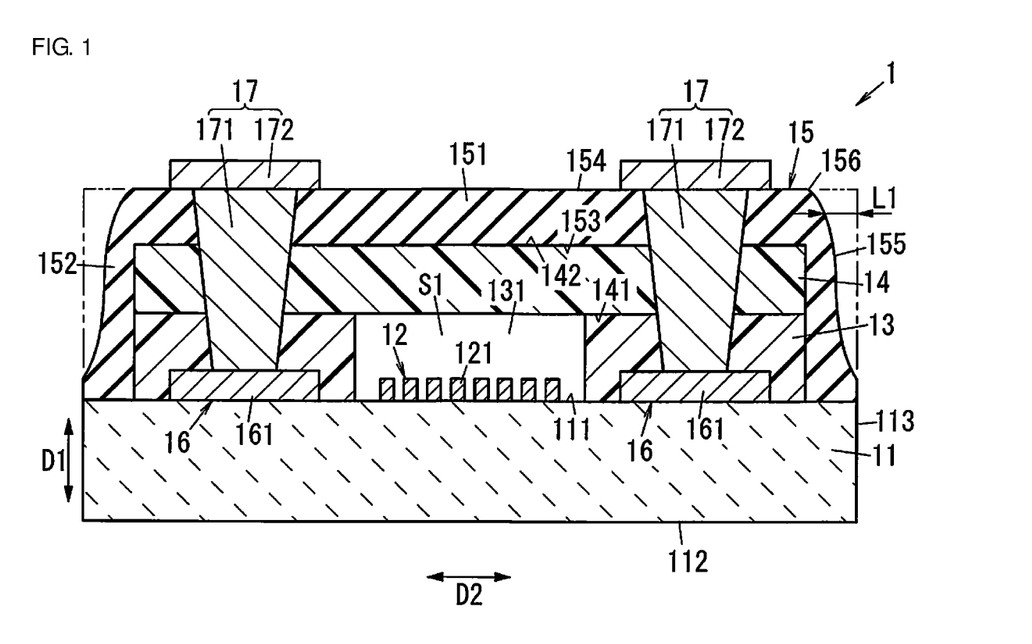
FIG. 1 is a sectional view of an elastic wave device according to a preferred embodiment of the present invention.

As illustrated in FIG. 1, an elastic wave device 1 according to the first preferred embodiment preferably includes a substrate 11, an interdigital transducer (IDT) electrode 12, a spacer layer 13, a cover 14, a protective layer 15, a plurality of (two in the illustrated example) wiring layers 16, and a plurality (two in the illustrated example) of outer connection electrodes 17. The elastic wave device 1 according to the first preferred embodiment is preferably a wafer level package (WLP) elastic wave device, and is used as a surface acoustic wave (SAW) filter, for example. Here, the term "WLP elastic wave device 1" refers to an elastic wave device of a type that is obtained by performing steps to provide the IDT electrodes 12, the spacer layers 13, the covers 14, the protective layers 15, the wiring layers 16, the outer connection electrodes 17 on the substrate 11, and then finally cutting the wafer into individual elastic wave devices 1.

Figure 3:
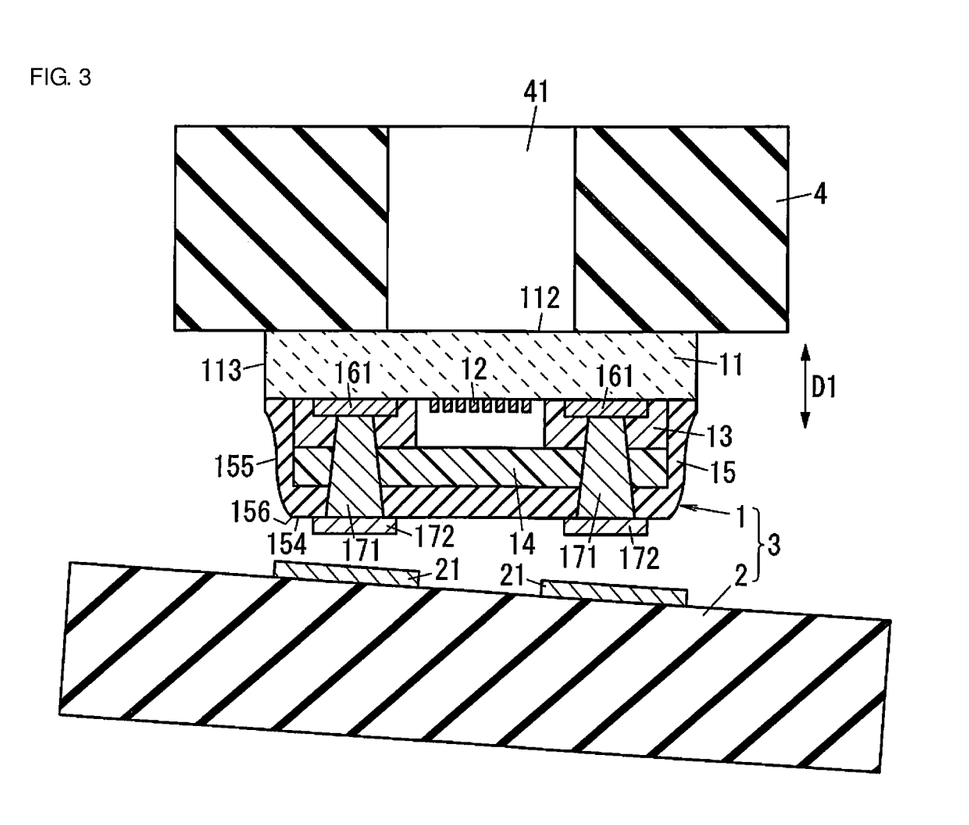
FIG. 3 is a sectional view of an elastic wave device according to a preferred embodiment of the present invention when the elastic wave device is mounted on a mounting substrate.

As illustrated in FIG. 3, the elastic wave device 1 is preferably mounted on a mounting substrate 2. An electronic component module 3 is defined by the elastic wave device 1 and the mounting substrate 2.

Next, the elements of the elastic wave device 1 according to the first preferred embodiment will be described while referring to the drawings.

Figure 2:
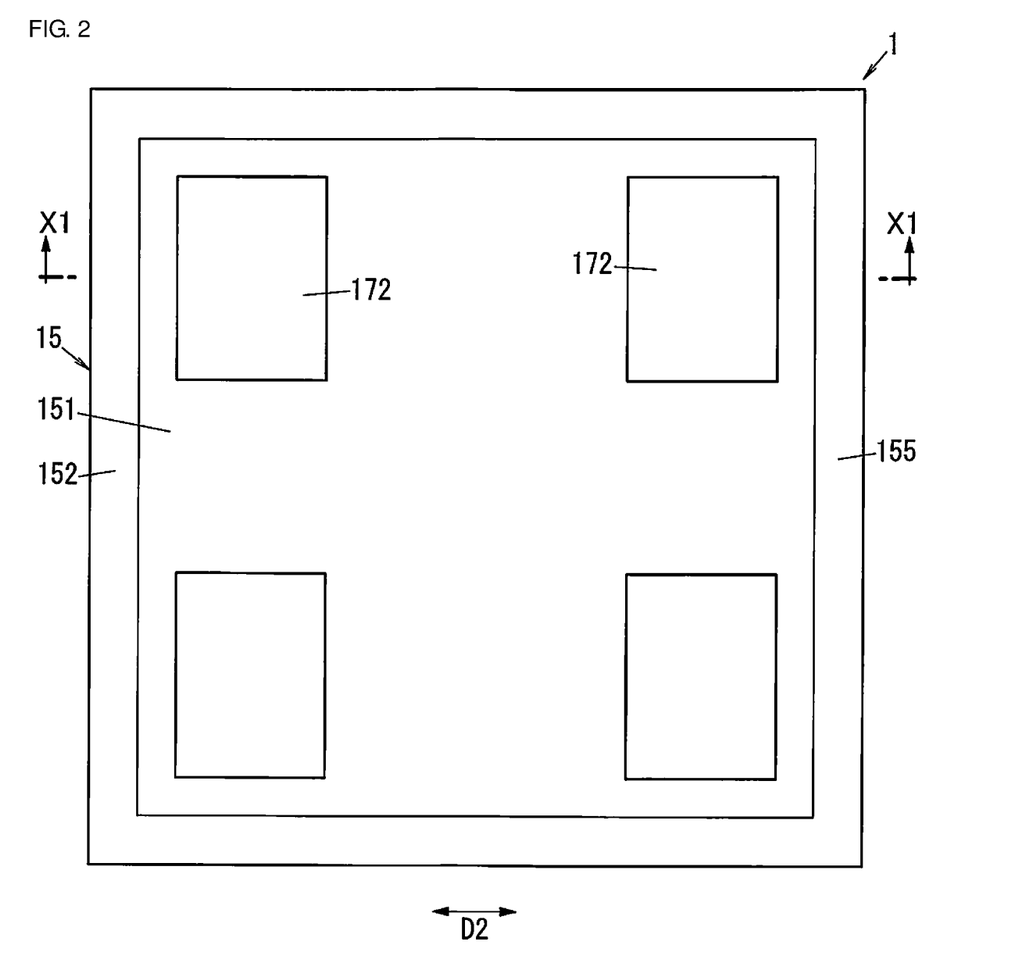
FIG. 2 is a plan view of an elastic wave device according to a preferred embodiment of the present invention.

As illustrated in FIG. 1, the substrate 11 supports the IDT electrode 12. The substrate 11 preferably includes a main surface 111 and a main surface 112, which are on opposite sides from each other in a thickness direction D1. The shape of the substrate 11 in a plan view (i.e., the outer peripheral shape when substrate 11 is viewed in thickness direction D1) is a square or substantially square shape as illustrated in FIG. 2, but the substrate 11 is not limited to having a square or substantially square shape in plan view and may instead have a quadrilateral or substantially quadrilateral shape other than a square or substantially square shape such as, for example, a rectangular or substantially rectangular shape. In addition, the shape of the substrate 11 in the plan view may be any shape other than a quadrilateral or substantially quadrilateral shape, if so desired.

The substrate 11 is preferably a piezoelectric substrate composed of a piezoelectric material. A suitable piezoelectric material such as, for example, lithium tantalate ($LiTaO_3$), lithium niobate ($LiNbO_3$), or quartz is preferably used as the piezoelectric material of the substrate 11.

As illustrated in FIG. 1, the IDT electrode 12 is provided so as to face the main surface 111 of the substrate 11 in the thickness direction D1 of the substrate 11. Here, the meaning of "the IDT electrode 12 is provided so as to face the main surface 111 of the substrate 11" includes both a case in which the IDT electrode 12 is provided so as to face the main surface 111 in a state of being spaced apart from the main surface 111 of the substrate 11 and a case in which the IDT electrode 12 is provided on the main surface 111 of the substrate 11. In the example in FIG. 1, the IDT electrode 12 is provided on the main surface 111 of the substrate 11. In addition, the case where the IDT electrode 12 is provided so as to face the main surface 111 in a state of being spaced apart from the main surface 111 of the substrate 11 includes a case where an oxide film or the like is provided on the main surface 111 of the substrate 11 and the IDT electrode 12 is provided on the oxide film, for example.

The IDT electrode 12 preferably includes a plurality of electrode fingers 121 and two busbars (not illustrated). The plurality of electrode fingers 121 are arranged side by side in a direction D2 that is perpendicular or substantially perpendicular to the thickness direction D1. The two busbars are preferably provided in an elongated shape in which the longitudinal direction thereof is the direction D2 and are electrically connected to the plurality of electrode fingers 121. In more detail, the plurality of electrode fingers 121 includes a plurality of first electrode fingers and a plurality of second electrode fingers. The plurality of first electrode fingers are electrically connected to a first busbar among the two busbars. The plurality of second electrode fingers are electrically connected to a second busbar among the two busbars.

The material of the IDT electrode 12 is a suitable metal material such as, for example, aluminum (Al), copper (Cu), platinum (Pt), gold (Au), silver (Ag), titanium (Ti), nickel (Ni), chromium (Cr), molybdenum (Mo), tungsten (W), or an alloy having any of these metals as a main constituent. In addition, the IDT electrode 12 may have a structure obtained by stacking a plurality of metal films composed of such metals or alloys.

As illustrated in FIG. 1, the spacer layer 13 is preferably provided on the main surface 111 side of the substrate 11 so as to be spaced apart from an outer edge 113 of the substrate 11. In the example in FIG. 1, the spacer layer 13 is provided on the main surface 111 of the substrate 11. The spacer layer 13 preferably has a rectangular or substantially rectangular frame-shaped outer peripheral shape and surrounds the IDT electrode 12 in a plan view in the thickness direction D1 of the substrate 11. The spacer layer 13 includes a through hole 131 through which the IDT electrode 12 is exposed. Here, "the spacer layer 13 is provided on the main surface 111 side of the substrate 11" means that the spacer layer 13 is preferably provided closer to the main surface 111 than to the main surface 112, which faces the main surface 111 in the thickness direction D1 of the substrate 11.

The spacer layer 13 has an electrically insulating property. The material of the spacer layer 13 is a composite resin such as, for example, an epoxy resin or a polyimide-based resin. In addition, the thickness of the spacer layer 13 in the thickness direction D1 is larger than the thickness of the IDT electrode 12.

As illustrated in FIG. 1, the cover 14 is provided on the spacer layer 13 so as to close the through hole 131 of the spacer layer 13. The cover 14 is spaced apart from the IDT electrode 12 in the thickness direction D1 of the substrate 11. The cover 14 preferably includes a first main surface 141 that is adjacent to the spacer layer 13 and a second main surface 142 that faces the first main surface 141. The cover 14 preferably has a flat or substantially flat plate shape. The shape of the cover 14 in plan view (outer peripheral shape when viewed in thickness direction D1 of substrate 11) is a rectangular or substantially rectangular shape, but the cover 14 is not limited to having a rectangular or substantially rectangular shape in plan view, and may instead have a quadrilateral or substantially quadrilateral shape other than a rectangular or substantially rectangular shape such as a square or substantially square shape. In addition, the shape of the cover 14 in plan view may be a shape other than a quadrilateral or substantially quadrilateral shape. The outer peripheral shape of the cover 14 is smaller than the outer peripheral shape of the substrate 11.

The cover 14 has an electrically insulating property. The material of the cover 14 is preferably a composite resin such as, for example, an epoxy-based resin or a polyimide-based resin. The cover 14 may be made from a single material or may be made from a plurality of materials. In addition, the cover 14 may be made from a suitable electrically insulating material other than the above resins, if so desired.

The cover 14 and the spacer layer 13 are preferably cured in the same thermal curing step. Therefore, it is preferable that the resin that defines the cover 14 and the resin that defines the spacer layer 13 be resins that are cured in the same or substantially the same temperature range. The cover 14 and the spacer layer 13 are more preferably made from the same resin. As a result, the spacer layer 13 and the cover 14 are able to be cured by being heated in the same temperature range, and the heating step is able to be simplified. In addition, in the case where the same resin is used, the bonding strength between the cover 14 and the spacer layer 13 is also able to be effectively increased.

In the elastic wave device 1, a space S1 surrounded by the cover 14, the spacer layer 13, and the substrate 11 has an inert gas atmosphere. The inert gas atmosphere is preferably an $N_2$ gas atmosphere, for example.

As illustrated in FIGS. 1 and 2, the protective layer 15 is provided so as to cover the cover 14. In more detail, the protective layer 15 is provided to cover a portion of the main surface 111 of the substrate 11, the spacer layer 13, and the cover 14.

The protective layer 15 has an electrically insulating property. The material of the protective layer 15 is preferably a composite resin such as, for example, an epoxy-based resin or a polyimide-based resin. The protective layer 15 may be made from a single material or may be made from a plurality of materials. In addition, the protective layer 15 may be made from a suitable electrically insulating material other than the above resins, if so desired.

The protective layer 15 includes a center region 151 and a region 152 that is located around the periphery of the center region 151. In addition, the protective layer 15 preferably includes a third main surface 153, a fourth main surface 154, and a side surface 155. The third main surface 153 contacts the second main surface 142. The fourth main surface 154 faces the third main surface 153 in the thickness direction D1 of the substrate 11. The side surface 155 is connected to the fourth main surface 154. In other words, the side surface 155 is provided so as to extend from the periphery of the fourth main surface 154 toward the substrate 11.

The region 152 is a region that at least includes a leading end portion of the protective layer 15 in the thickness direction D1 of the substrate 11, and is a region in which a distance L1 between the side surface 155 of the protective layer 15 and the outer edge 113 of the substrate 11 in the direction D2 perpendicular to the thickness direction D1 increases as the distance from the substrate 11 in the thickness direction D1 increases. In other words, the periphery of the leading end portion of protective layer 15 is recessed in the upper region of FIG. 1. In FIG. 1, the distance L1 increases and the side surface 155 of the protective layer 15 is located farther inward in the direction D2 as the distance from the substrate 11 in thickness direction D1 increases. In other words, the portion of the side surface 155 of the protective layer 15 that includes an intersection line 156 between the side surface 155 and the fourth main surface 154 is located farther inward than the outer edge 113 of the substrate 11 in a plan view in the thickness direction D1 of the substrate 11. That is, the portion of the side surface 155 of the protective layer 15 that is on the fourth main surface 154 side is located farther inward than the outer edge 113 of the substrate 11 in a plan view in the thickness direction D1. Here, "the leading end portion of the protective layer 15" refers to a portion of the protective layer 15 that is on the opposite side, in the thickness direction D1 of the substrate 11, from the portion of the protective layer 15 that contacts the cover 14. In other words, "the leading end portion of the protective layer 15" refers to the portion of the protective layer 15 where outer electrodes 172, which are described later, are provided.

In addition, as illustrated in FIGS. 1 and 2, the protective layer 15 is provided such that the distance L1 between the side surface 155 of the protective layer 15 and the outer edge 113 of the substrate 11 increases as the distance from the substrate 11 in the thickness direction D1 of the substrate 11 increases along the entire periphery of the protective layer 15. That is, the region 152 of the protective layer 15 is preferably provided along the entire periphery of the protective layer 15. In other words, the side surface 155 of the protective layer 15 is provided along the entire periphery of the protective layer 15 and the portion of the side surface 155 that includes the intersection line 156 between the side surface 155 and the fourth main surface 154 is located farther inward than the outer edge 113 of the substrate 11 in a plan view in the thickness direction D1 of the substrate 11. That is, the portion of the side surface 155 of the protective layer 15 that is on the fourth main surface 154 side is located farther inward than the outer edge 113 of the substrate 11 in a plan view in the thickness direction D1.

As illustrated in FIG. 1, the wiring layers 16 are preferably provided on the main surface 111 of the substrate 11 and electrically connect the IDT electrode 12 and through vias 171, which are described later, to each other. The wiring layers 16 include two pad electrodes 161. The pad electrodes 161 are interposed between the substrate 11 and the spacer layer 13 and are positioned inside the outer periphery of the spacer layer 13 and outside the inner periphery of the spacer layer 13.

The wiring layers 16 are preferably made of a suitable metal material such as, for example, aluminum, copper, platinum, gold, silver, titanium, nickel, chromium, molybdenum, tungsten, or an alloy having any of these metals as a main constituent. In addition, the wiring layers 16 may have a structure obtained by stacking a plurality of metal films composed of such metals or alloys.

As illustrated in FIGS. 1 and 3, the outer connection electrodes 17 are electrodes that electrically connect the elastic wave device 1 to the mounting substrate 2. The outer connection electrodes 17 are electrically connected to the IDT electrode 12 and include through vias 171 and outer electrodes 172.

The through vias 171 penetrate through the spacer layer 13, the cover 14, and the protective layer 15 in the thickness direction D1 of the substrate 11. The through vias 171 are made of a suitable metal material such as, for example, copper or nickel or an alloy having such a metal as a main constituent.

The outer electrodes 172 are provided on the through vias 171 so as to be exposed to the outside. The outer electrodes 172 are preferably made of a suitable metal material such as, for example, nickel or gold or an alloy having such a metal as a main constituent.

As illustrated in FIG. 3, the elastic wave device 1 is preferably placed on the mounting substrate 2 using a mounting nozzle 4 (collet, suction tool) including a suction hole 41 and is then mounted on the mounting substrate 2 by being subjected to heating, pressing, etc. Thus, the electronic component module 3 is provided.

When mounting the elastic wave device 1 on the mounting substrate 2, the mounting nozzle 4 sucks the main surface 112 of the substrate 11. Then, the mounting nozzle 4 orients the outer electrodes 172 side of the elastic wave device 1 in the thickness direction D1 of the substrate 11, that is, the protective layer 15 side of the elastic wave device 1 toward the mounting substrate 2.

At this time, as illustrated in FIG. 3, the mounting substrate 2 may be tilted with respect to the elastic wave device 1. As described above, the leading end portion (lower end portion in FIG. 3) of the protective layer 15 of the elastic wave device 1 is recessed. In other words, the protective layer 15 preferably includes the region 152 that is a region that includes the leading end portion of the protective layer 15 in the thickness direction D1 and is a region in which the distance L1 between the side surface 155 of the protective layer 15 and the outer edge 113 of the substrate 11 in the direction D2 perpendicular to the thickness direction D1 increases as the distance from the substrate 11 in the thickness direction D1 increases. That is, the portion of the side surface 155 of the protective layer 15 that is on the fourth main surface 154 side is located farther inward than the outer edge 113 of the substrate 11 in a plan view in the thickness direction D1. Therefore, the occurrence of a situation in which a corner of the elastic wave device 1 hits the mounting substrate 2 is able to be reduced or prevented even in the case where the mounting substrate 2 is tilted with respect to the elastic wave device 1. Consequently, the plurality of outer electrodes 172 are able to stably contact terminals 21 of the mounting substrate 2 while reducing or preventing generation of cracks in the protective layer 15.

Next, a preferred embodiment of a method of manufacturing the elastic wave device 1 according to the first preferred embodiment will be described while referring to FIGS. 4A to 4F and FIGS. 5A to 5E. The elastic wave device 1 according to the first preferred embodiment is a manufacturing sequence preferably including first to eleventh steps, for example.

Figure 4A:
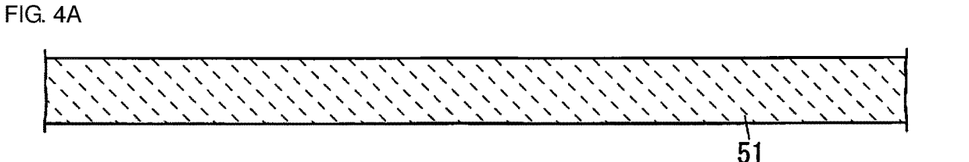

As illustrated in FIG. 4A, in a first step, a wafer 51, which defines the basis of the substrates 11 of a plurality of elastic wave devices 1, is prepared.

Figure 4B:
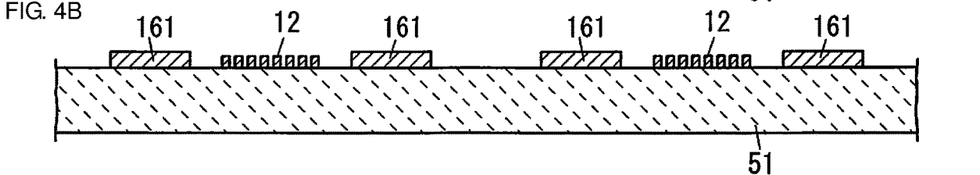

As illustrated in FIG. 4B, in a second step, a plurality (preferably two in the illustrated example) of IDT electrodes 12 and a plurality (preferably four in the illustrated example) of pad electrodes 161 are formed on the wafer 51 using thin film fine processing techniques.

Figure 4C:
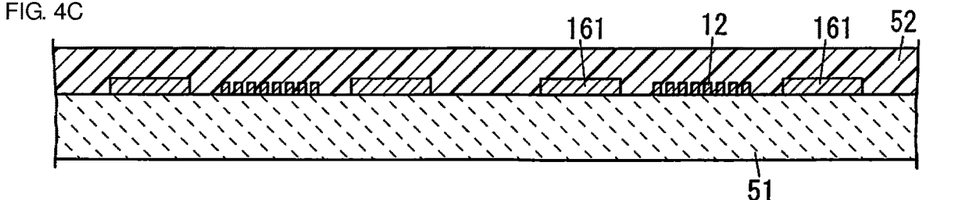

As illustrated in FIG. 4C, in a third step, a resin is applied so as to cover the entire upper surface of the wafer 51 and a resin film 52, which will define a plurality of spacer layers 13, is formed.

Figure 4D:
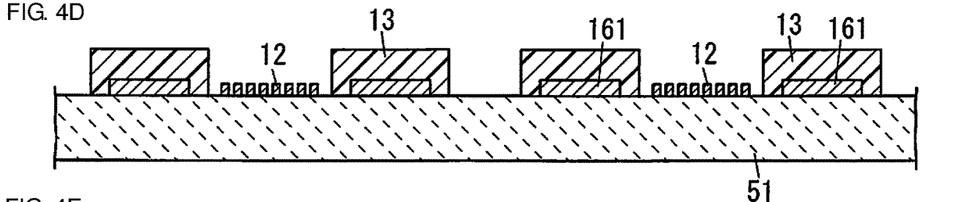

As illustrated in FIG. 4D, in a fourth step, a plurality (two in the illustrated example) of spacer layers 13 are formed by patterning the resin film 52 using a photolithography method. In the fourth step, the resin film 52 is not cured by being heated.

Figure 4E:
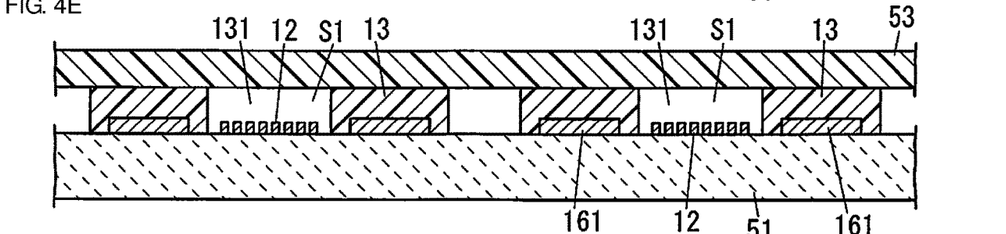

As illustrated in FIG. 4E, in a fifth step, a resin film 53, which defines the basis of covers 14, is formed on the spacer layers 13 using a lamination process. Through holes 131 of the spacer layers 13 are closed by the resin film 53. The entire object is heated after performing the lamination process. Consequently, the spacer layers 13 and the covers 14 are cured. As a result, the covers 14 and the spacer layers 13 are bonded to each other, and spaces S1 that the IDT electrodes 12 face are formed.

Figure 4F:
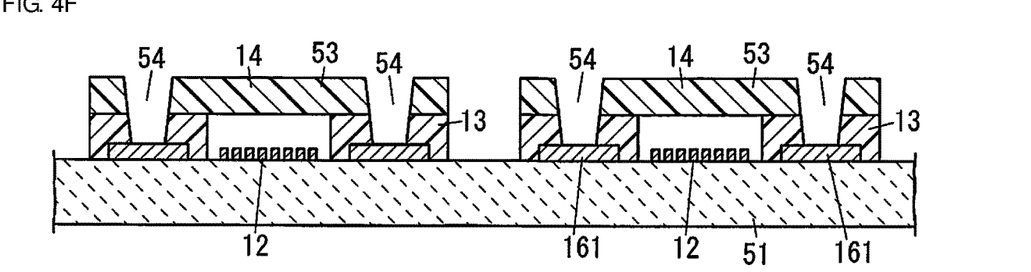

As illustrated in FIG. 4F, in a sixth step, a plurality (preferably four in the illustrated example) of through holes 54 are formed so as to penetrate through the spacer layers 13 and the covers 14 using, for example, laser processing or the like. Thus, the plurality of pad electrodes 161 are exposed. In addition, the portions of the resin film 53 disposed between two adjacent spacer layers 13 are removed such that the thus-formed individual resin films 53 extend along the peripheries of the spacer layers 13.

Figure 5A:
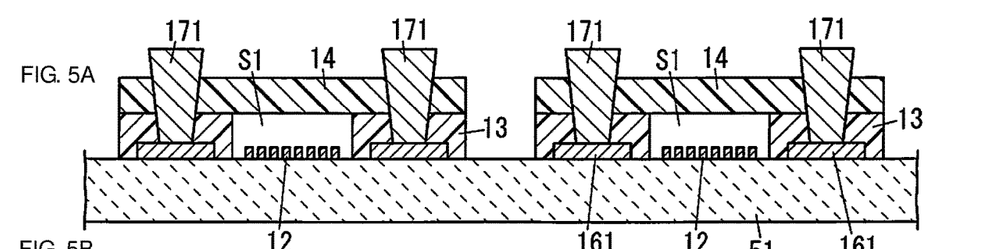

As illustrated in FIG. 5A, in a seventh step, a plurality (preferably four in the illustrated example) of through vias 171 are formed. In more detail, first, a seed layer (i.e., an underfilm) is formed. Next, the seed layer is subjected to patterning using a photomask and a resist film is formed on the seed layer such that the places where the through vias 171 are to be formed are exposed. Then, the through vias 171 are formed on the exposed portions of the seed layer using electroplating. After that, the resist film is removed, and additionally the seed layer underlying the removed resist film is removed.

Figure 5B:
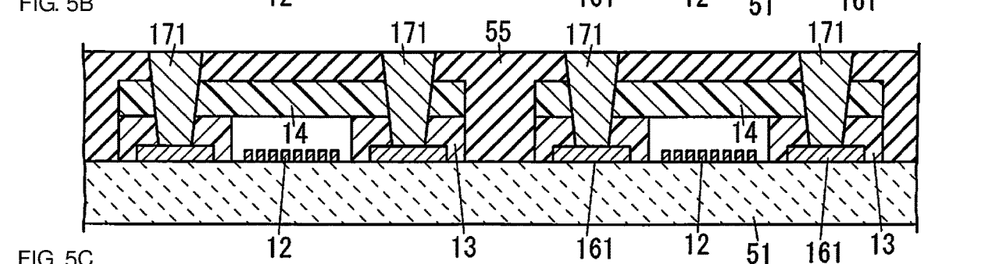

As illustrated in FIG. 5B, in an eighth step, a resin film 55, which defines the basis of protective layers 15, is formed. In more detail, first, resin, which defines the basis of the resin film 55, is applied and cured such that a portion of the wafer 51, the spacer layers 13, the covers 14, and the through vias 171 are covered. Next, the resin film 55 is preferably subjected to grinding until the through vias 171 are exposed.

Figure 5C:
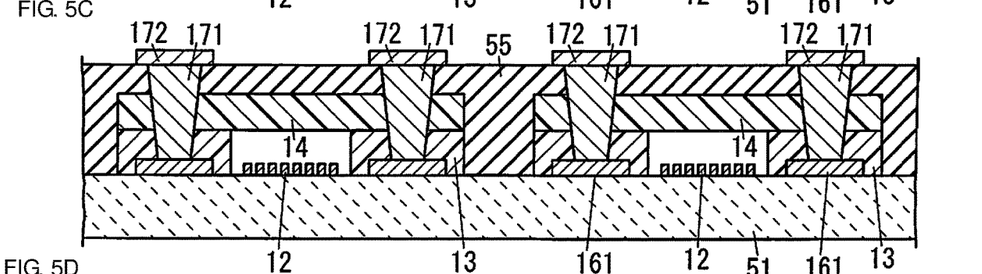

As illustrated in FIG. 5C, in a ninth step, outer electrodes 172 are formed on the through vias 171. In more detail, first, a seed layer is formed. Next, the seed layer is subjected to patterning using a photomask and a resist film is formed on the seed layer such that the positions where the outer electrodes 172 are to be provided are exposed. Then, the outer electrodes 172 are formed on the exposed portions of the seed layer using electroplating. After that, the resist film is removed, and additionally the seed layer underlying the removed resist film is removed.

Figure 5D:
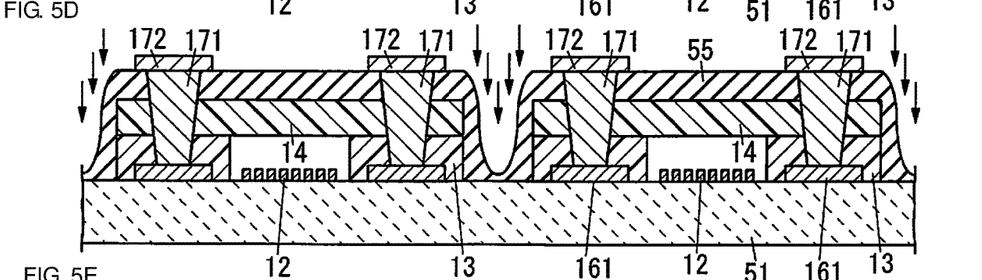

As illustrated in FIG. 5D, in a tenth step, portions of the resin film 55 in the regions at the ends of the elastic wave devices 1 are removed. In more detail, the resin film 55 is preferably subjected to an ablation process by, for example, radiating laser light in the direction of the arrows in FIG. 5D. Portions of the resin film 55 are removed such that the surface of the resin film 55 is formed to have a prescribed shape by changing the target depth of the laser light at each position in these regions.

Figure 5E:
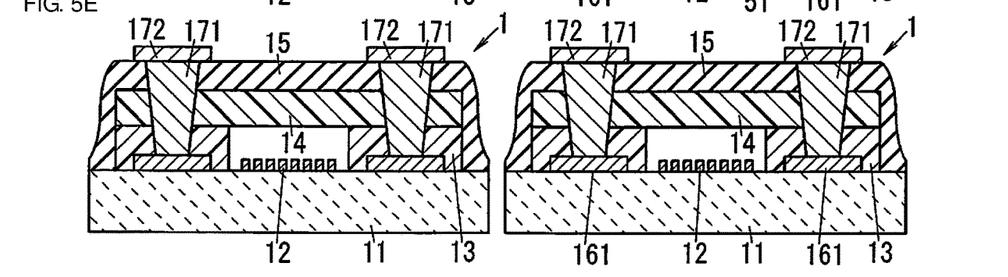

As illustrated in FIG. 5E, in an eleventh step, the resin film 55 and the wafer 51 are preferably cut using, for example, a dicing apparatus or the like. Thus, a plurality (preferably two in the illustrated example) of elastic wave devices 1 can be obtained.

The above-described manufacturing method is an example of a preferred embodiment of a method for manufacturing the elastic wave device 1, and the elastic wave device 1 may instead be manufactured using another manufacturing method.

As described above, in the elastic wave device 1 according to the first preferred embodiment, the side surface 155 of the protective layer 15 is located farther inward as the distance from the substrate 11 in the thickness direction D1 of the substrate 11 increases. In other words, in the elastic wave device 1, the portion of the side surface 155 of the protective layer 15 that includes an intersection line 156 between the side surface 155 and the fourth main surface 154 is located farther inward than the outer edge 113 of the substrate 11 in a plan view in the thickness direction D1 of the substrate 11. That is, in the elastic wave device 1, at least the portion of the side surface 155 of the protective layer 15 that is on the fourth main surface 154 side is located farther inward than the outer edge of the substrate 11 in a plan view in the thickness direction D1. That is, the leading end portion of the protective layer 15 is recessed in the thickness direction D1 of the substrate 11. As a result, when mounting the elastic wave device 1 on the mounting substrate 2, the occurrence of a situation in which a corner of the elastic wave device 1 collides with the mounting substrate 2 (a corner of the elastic wave device 1 hits the mounting substrate 2) is able to be reduced even in the case where the mounting substrate 2 is tilted with respect to the elastic wave device 1. As a result, the likelihood of cracks being generated is able to be reduced or eliminated. In addition, a reduction in the sealing property provided by the protective layer 15 is able to be decreased or prevented.

In the elastic wave device 1 according to the first preferred embodiment, the side surface 155 of the protective layer 15 is preferably located farther inward as the distance from the substrate 11 in the thickness direction D1 of the substrate 11 increases along the entire periphery of the protective layer 15. In other words, the side surface 155 of the protective layer 15 is preferably provided along the entire periphery of the protective layer 15 and the portion of the side surface 155 that includes the intersection line 156 between the side surface 155 and the fourth main surface 154 is located farther inward than the outer edge 113 of the substrate 11. That is, the side surface 155 of the protective layer 15 is preferably provided along the entire periphery of the protective layer 15 and the portion of the side surface 155 that is on the fourth main surface 154 side is located farther inward than the outer edge 113 of the substrate 11. As a result, when mounting the elastic wave device 1 on the mounting substrate 2, the occurrence of a situation in which a corner of the elastic wave device 1 collides with the mounting substrate 2 is able to be reduced or prevented regardless of how the mounting substrate 2 is tilted with respect to the elastic wave device 1, and consequently, the generation of cracks in the protective layer 15 is able to be reduced or prevented.

In the elastic wave device 1 according to the first preferred embodiment, the through vias 171 are provided to penetrate through the spacer layer 13, the cover 14, and the protective layer 15. Thus, the air tightness of the space S1 surrounded by the substrate 11, the spacer layer 13, and the cover 14 is able to be improved, and therefore reliability is able to be improved.

Modifications to First Preferred Embodiment

Hereafter, modifications of the first preferred embodiment will be described.

In the elastic wave device 1, the region 152 of the protective layer 15 is not limited to being provided along the entire periphery of the protective layer 15. It is sufficient that the region 152 of the protective layer 15 be provided along a portion of the protective layer 15.

The elastic wave device 1 may have a configuration that includes a high-acoustic-velocity support substrate and a piezoelectric film instead of the substrate 11, which is a piezoelectric substrate. In this configuration, a piezoelectric film is preferably provided on a high-acoustic-velocity support substrate. The high-acoustic-velocity support substrate is a substrate in which the acoustic velocity of a propagating elastic wave (bulk wave) is higher than the acoustic velocity of an elastic wave propagating along the piezoelectric film.

The elastic wave device 1 may have a configuration that includes a high-acoustic-velocity support substrate, a low-acoustic-velocity film, and a piezoelectric film instead of the substrate 11. In this configuration, a low-acoustic-velocity film and a piezoelectric film are provided in this order on a high-acoustic-velocity support substrate. The low-acoustic-velocity film is a film in which the acoustic velocity of a propagating elastic wave (bulk wave) is lower than the acoustic velocity of an elastic wave propagating along the piezoelectric film.

The elastic wave device 1 may have a configuration that includes a support substrate, a high-acoustic-velocity film, a low-acoustic-velocity film, and a piezoelectric film instead of the substrate 11. In this configuration, a high-acoustic-velocity film, a low-acoustic-velocity film, and a piezoelectric film are stacked in this order on a support substrate. The high-acoustic-velocity support film is a film in which the acoustic velocity of a propagating elastic wave (bulk wave) is higher than the acoustic velocity of an elastic wave propagating along the piezoelectric film.

According to the first preferred embodiment and the modifications thereof, it is sufficient that the elastic wave device 1 include a substrate that has a piezoelectric property in at least portion thereof.

In the first preferred embodiment, a portion of the side surface 155 of the protective layer 15 that is on the fourth main surface 154 side is located farther inward than the outer edge 113 of the substrate 11 in a plan view in the thickness direction D1 of the substrate 11, whereas as a modification of the first preferred embodiment, the entirety of the side surface 155 of the protective layer 15 may be located farther inward than the outer edge 113 of the substrate 11 in a plan view in the thickness direction D1 of the substrate 11. That is, it is sufficient that at least portion of the side surface 155 of the protective layer 15 that is on the fourth main surface 154 side be located farther inward than the outer edge 113 of the substrate 11 in a plan view in the thickness direction D1 of the substrate 11.

The elastic wave devices 1 according to the above-described modifications exhibit the same effects as the elastic wave device 1 according to the first preferred embodiment.

Second Preferred Embodiment

Figure 6:
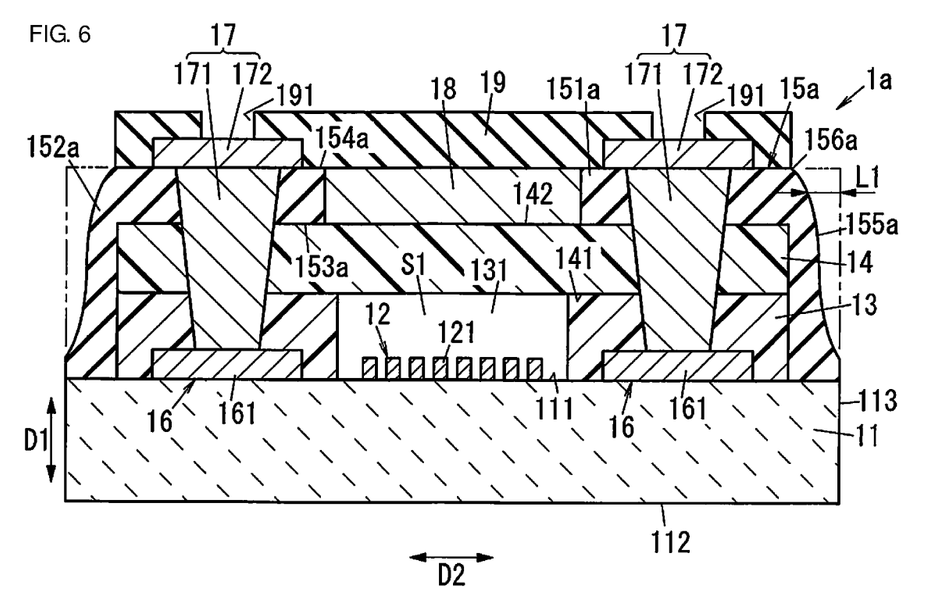
FIG. 6 is a sectional view of an elastic wave device according to a preferred embodiment of the present invention.

As illustrated in FIG. 6, an elastic wave device 1a according to a second preferred embodiment preferably differs from the elastic wave device 1 according to the first preferred embodiment (refer to FIG. 1) in that the elastic wave device 1a includes a pattern layer 18. Elements of the elastic wave device 1a according to the second preferred embodiment that are the same as in the elastic wave device 1 according to first preferred embodiment are denoted by the same symbols and description thereof is omitted.

As illustrated in FIG. 6, the elastic wave device 1a preferably includes a pattern layer 18 and a protective resist layer 19. In addition, the elastic wave device 1a includes a protective layer 15a instead of the protective layer 15 (refer to FIG. 1). Similarly to the elastic wave device 1 according to the first preferred embodiment, the elastic wave device 1a preferably includes the substrate 11, the IDT electrode 12, the spacer layer 13, the cover 14, the wiring layers 16, and the outer connection electrodes 17.

The pattern layer 18 is provided on the second main surface 142 of the cover 14. The pattern layer 18 defines a reactance element such as, for example, an inductor or a capacitor. The pattern layer 18 may be electrically connected to the IDT electrode 12 or may be provided so as to be electrically isolated from the IDT electrode 12.

Similarly to the protective layer 15, the protective layer 15a preferably includes a center region 151a and a region 152a that is located around the periphery of the center region 151a. In addition, similarly to the protective layer 15 of the first preferred embodiment, the protective layer 15a preferably includes a third main surface 153a, a fourth main surface 154a, and a side surface 155a. The third main surface 153a contacts the second main surface 142. The fourth main surface 154a faces the third main surface 153a in the thickness direction D1 of the substrate 11. The side surface 155a is connected to the fourth main surface 154a. In other words, the side surface 155a is provided so as to extend from the periphery of the fourth main surface 154a toward the substrate 11. The configuration and function of the protective layer 15a of the second preferred embodiment are the same as those of the protective layer 15 of the first preferred embodiment, and description thereof is omitted.

The region where the pattern layer 18 is provided penetrates through the center region 151a of the protective layer 15a such that the pattern layer 18 is exposed in the center region 151a of the protective layer 15a.

Similarly to the region 152 of the protective layer 15, in the region 152a of the protective layer 15a, the distance L1 between the side surface 155a of the protective layer 15a and the outer edge 113 of the substrate 11 in the direction D2 perpendicular to the thickness direction D1 preferably increases as the distance from the substrate 11 in the thickness direction D1 increases. In other words, the portion of the side surface 155a of the protective layer 15a that includes an intersection line 156a between the side surface 155a and the fourth main surface 154a is located farther inward than the outer edge 113 of the substrate 11 in a plan view in the thickness direction D1 of the substrate 11. That is, the portion of the side surface 155a of the protective layer 15a that is on the fourth main surface 154a side is located farther inward than the outer edge 113 of the substrate 11 in a plan view in the thickness direction D1.

The protective resist layer 19 is provided on the protective layer 15a. The protective resist layer 19 has through holes 191 such that at least a portion of each outer electrode 172 of the outer connection electrodes 17 is exposed therethrough. The protective resist layer 19 is preferably defined so as not to protrude beyond the protective layer 15a in the direction D2. The protective resist layer 19 is provided in order to reduce wet spreading of solder when providing solder on the outer electrodes 172.

Next, a preferred embodiment of a method for manufacturing the elastic wave device 1a according to the second preferred embodiment will be described. The elastic wave device 1a according to the second preferred embodiment is preferably manufactured using first to twelfth steps, for example. Description of portions that are the same as in the method for manufacturing the elastic wave device 1 according to the first preferred embodiment are omitted as appropriate.

In a first step, a wafer, which defines the basis of the substrates 11 of a plurality of elastic wave devices 1a, is prepared.

In a second step, a plurality of IDT electrodes 12 and a plurality of pad electrodes 161 are formed on the wafer.

In a third step, a resin is applied so as to cover the entire upper surface of the wafer and a resin film, which defines the basis of a plurality of spacer layers 13, is formed.

In a fourth step, a plurality of spacer layers 13 are formed by patterning the resin layer.

In a fifth step, a resin film, which defines the basis of covers 14, is formed on the spacer layers 13 using a lamination process. Through holes 131 of the spacer layers 13 are closed by the resin film. The entire object is heated after performing the lamination process.

In a sixth step, a plurality of through holes are formed so as to penetrate through the spacer layers 13 and the covers 14. In addition, portions of the resin film disposed between two adjacent spacer layers 13 are removed such that the thus-formed individual resin films extend along the peripheries of the spacer layers 13.

In a seventh step, a plurality of through vias 171 and pattern layers 18 are formed. In more detail, first, a seed layer is formed. Next, the seed layer is preferably patterned using a photomask and a resist layer is formed such that the places where the through vias 171 and the pattern layers 18 are to be formed are exposed. Then, the through vias 171 are formed in the through holes formed in the sixth step. In addition, the pattern layers 18 are formed on the second main surfaces 142 of the covers 14. After that, the resist film is removed, and additionally the seed layer underlying the removed resist film is removed.

In an eighth step, a resin film that defines the basis of the protective layers 15a is formed. In more detail, first, resin that defines the basis of a resin film is applied and cured such that a portion of the wafer, the spacer layers 13, the covers 14, and the through vias 171 are covered. Next, the resin film is preferably subjected to grinding until the through vias 171 are exposed.

In a ninth step, the outer electrodes 172 are formed on the through vias 171.

In a tenth step, a resist film that defines the basis of the protective resist layers 19 is formed on the protective layers 15a and the outer electrodes 172. In more detail, first, a seed layer is formed, and then the seed layer is patterned using a photomask and a resist film is formed such that portions of the outer electrodes 172 are exposed.

In an eleventh step, portions of the resin film formed in the eighth step and parts of the resist film formed in the tenth step are removed from regions at the ends of the elastic wave devices 1a. In more detail, the resin film and the resist film are subjected to an ablation process by radiating laser light. Parts of the resin film and portions of the resist film are removed such that the surfaces of the resin films and the resist films come to have a prescribed shape by changing the target depth of the laser light at each position in these regions.

In a twelfth step, the resin film and the wafer are cut using a dicing apparatus or the like. Thus, a plurality of elastic wave devices 1a are able to be obtained.

The above-described manufacturing method is an example of a method of manufacturing the elastic wave device 1a, and the elastic wave device 1a may instead be manufactured using another manufacturing method.

As described above, in the elastic wave device 1a according to the second preferred embodiment, the pattern layer 18 is able to be provided in an integrated manner, and therefore an increase in size is able to be avoided even though the pattern layer 18 has been added.

Modifications to Second Preferred Embodiment

Hereafter, modifications of the second preferred embodiment will be described.

Similarly to the modifications of the first preferred embodiment, as a modification of the second preferred embodiment, the elastic wave device 1a may have a configuration that includes a high-acoustic-velocity support substrate and a piezoelectric film instead of the substrate 11. Alternatively, the elastic wave device 1a may have a configuration that includes a high-acoustic-velocity support substrate, a low-acoustic-velocity film, and a piezoelectric film instead of the substrate 11 or a configuration that includes a support substrate, a high-acoustic-velocity film, a low-acoustic-velocity film, and a piezoelectric film instead of the substrate 11.

In the second preferred embodiment, a portion of the side surface 155a of the protective layer 15a that is on the fourth main surface 154a side is located farther inward than the outer edge 113 of the substrate 11 in a plan view in the thickness direction D1 of the substrate 11, whereas as a modification of the second preferred embodiment, the entirety of the side surface 155a of the protective layer 15a may be located farther inward than the outer edge 113 of the substrate 11 in a plan view in the thickness direction D1 of the substrate 11. That is, it is sufficient that at least a portion of the side surface 155a of the protective layer 15a that is on the fourth main surface 154a side be located farther inward than the outer edge 113 of the substrate 11 in a plan view in the thickness direction D1 of the substrate 11.

The elastic wave devices 1a according to the above-described modifications exhibit the same advantageous effects as the elastic wave device 1a according to the second preferred embodiment 2.

The above-described embodiments and modifications are merely examples of various embodiments and modifications of the present invention. In addition, as long as the advantageous effects of the present invention are achieved, the embodiments and modifications may be changed in various ways in accordance with the design and other factors.

The following preferred embodiments of the present invention are disclosed based on the above-described embodiments and modifications.

An elastic wave device (1; 1a) according to a preferred embodiment of the present invention includes a substrate (11); an IDT electrode (12); a spacer layer (13); a cover (14); and a protective layer (15; 15a). The substrate (11) has a piezoelectric property in at least a portion thereof. The IDT electrode (12) is provided on the substrate (11). The spacer layer (13) is provided on the substrate (11) and surrounds the IDT electrode (12). The cover (14) is provided on the spacer layer (13) and is spaced apart from the IDT electrode (12). The cover (14) includes a first main surface (141) that is adjacent to the spacer layer (13) and a second main surface (142) that faces the first main surface (141). The protective layer (15; 15a) is provided on the cover (14) and includes a third main surface (153; 153a) that contacts the second main surface (142), a fourth main surface (154; 154a) that faces the third main surface (153; 153a), and a side surface (155; 155a) that is connected to the fourth main surface (154; 154a). In at least a portion of the side surface (155; 155a) of the protective layer (15; 15a), a portion that includes an intersection line (156; 156a) between the side surface (155; 155a) and the fourth main surface (154; 154a) is located further inward than an outer edge (113) of the substrate (11) in a plan view in a thickness direction (D1) of the substrate (11).

In an elastic wave device (1; 1a) according to a preferred embodiment of the present invention, in at least a portion of the side surface (155; 155a) of the protective layer (15; 15a), a portion that includes the intersection line (156; 156a) between the side surface (155, 155a) and the fourth main surface (154; 154a) is located further inward than the outer edge (113) of the substrate (11). That is, a leading end portion of the protective layer (15, 15a) is recessed in the thickness direction D1 of the substrate (11). Consequently, when mounting the elastic wave device (1; 1a) on a mounting substrate (2), the occurrence of a situation in which a corner of the elastic wave device (1; 1a) collides with the mounting substrate (2) is able to be reduced or prevented even when the mounting substrate (2) is tilted with respect to the elastic wave device (1; 1a). As a result, the likelihood of cracks being generated is able to be reduced or prevented. In addition, a reduction in the sealing property provided by the protective layer (15; 15a) is able to be reduced or prevented.

In an elastic wave device (1; 1a) according to a preferred embodiment of the present invention, the side surface (155; 155a) of the protective layer (15; 15a) is provided along the entire or substantially the entire periphery of the protective layer (15; 15a) and a portion that includes the intersection line (156; 156a) between the side surface (155, 155a) and the fourth main surface (154; 154a) is located further inward than the outer edge (113) of the substrate (11) in a plan view in the thickness direction (D1).

With an elastic wave device (1; 1a) according to a preferred embodiment of the present invention, when mounting the elastic wave device (1; 1a) on the mounting substrate (2), the occurrence of a situation in which a corner of the elastic wave device (1; 1a) collides with the mounting substrate (2) is able to be reduced or prevented regardless of how the mounting substrate (2) is tilted with respect to the elastic wave device (1; 1a), and therefore the generation of cracks in the protective layer (15, 15a) is able to be reduced or prevented.

An elastic wave device (1; 1a) according to a preferred embodiment of the present invention further includes an outer connection electrode (17). The outer connection electrode (17) is electrically connected to the IDT electrode (12). The outer connection electrode (17) includes a through via (171). The through via (171) penetrates through the spacer layer (13), the cover member (14), and the protective layer (15, 15a).

In an elastic wave device (1; 1a) according to a preferred embodiment of the present invention, the air-tightness of a space (S1) surrounded by the substrate (11), the spacer layer (13), and the cover member (14) is able to be increased, and therefore the reliability of the elastic wave device (1; 1a) is able to be improved.

An elastic wave device (1a) according to a preferred embodiment of the present invention further includes a pattern layer (18). The pattern layer (18) is provided inside the protective layer (15; 15a).

In an elastic wave device (1a) according to a preferred embodiment of the present invention, the pattern layer (18) is able to be provided in an integrated manner, and therefore an increase in size is able to be reduced or prevented even though the pattern layer (18) has been added.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a substrate that has a piezoelectric property in at least portion thereof;
   an IDT electrode that is provided on the substrate;
   a spacer layer that is provided on the substrate and surrounds the IDT electrode;
   a cover that is provided on the spacer layer, is spaced apart from the IDT electrode, and includes a first main surface that is adjacent to the spacer layer and a second main surface that faces the first main surface; and
   a protective layer that is provided on the cover and includes a third main surface that contacts the second main surface, a fourth main surface that faces the third main surface, and a side surface that is connected to the fourth main surface; wherein
   in at least a portion of the side surface of the protective layer, a portion that includes an intersection line between the side surface and the fourth main surface is located farther inward than an outer edge of the substrate in a plan view in a thickness direction of the substrate; and
   at least a portion of the protective layer extends onto a main surface of the substrate and extends to the outer edge of the substrate.

2. The elastic wave device according to claim 1, wherein the side surface of the protective layer is provided along an entire periphery of the protective layer and the portion that includes the intersection line between the side surface and the fourth main surface is located farther inward than the outer edge of the substrate in a plan view in the thickness direction.

3. The elastic wave device according to claim 1, further comprising:
an outer connection electrode that is electrically connected to the IDT electrode; wherein
the outer connection electrode includes a through via that penetrates through the spacer layer, the cover, and the protective layer.

4. The elastic wave device according to claim 1, further comprising:
a pattern layer that is provided inside the protective layer.

5. The elastic wave device according to claim 1, wherein the substrate is made of lithium tantalate, lithium niobate, or quartz.

6. The elastic wave device according to claim 1, wherein the IDT electrode includes a plurality of electrode fingers arranged side by side in a direction that is perpendicular to a thickness direction of the substrate.

7. The elastic wave device according to claim 6, wherein the IDT electrode is made of aluminum, copper, platinum, gold, silver, titanium, nickel, chromium, molybdenum, or tungsten; or an alloy including aluminum, copper, platinum, gold, silver, titanium, nickel, chromium, molybdenum, or tungsten as a main constituent.

8. The elastic wave device according to claim 1, wherein the substrate includes an outer edge;
the spacer layer is spaced apart from the outer edge of the substrate and has a rectangular or substantially rectangular frame-shaped outer peripheral shape.

9. The elastic wave device according to claim 8, wherein the spacer layer includes a through hole through which the IDT electrode is exposed.

10. The elastic wave device according to claim 8, wherein a distance between an outer periphery of the protective layer and the outer edge of the substrate in a plan view decreases as the protective layer is closer to the substrate in a thickness direction of the elastic wave device.

11. The elastic wave device according to claim 1, wherein the spacer layer is electrically insulating and made from an epoxy resin or a polyimide-based resin.

12. The elastic wave device according to claim 1, wherein the cover is electrically insulating and made from an epoxy resin or a polyimide-based resin.

13. The elastic wave device according to claim 1, wherein the spacer layer and the cover are made from a same resin.

14. The elastic wave device according to claim 1, wherein the protective layer is electrically insulating and made from an epoxy-based resin or a polyimide-based resin.

15. The elastic wave device according to claim 1, wherein
a space is defined between the substrate, the cover, and the spacer layer; and
the space has an inert gas atmosphere.

16. The elastic wave device according to claim 1, wherein the protective layer encapsulates the cover and the spacer layer.

17. The elastic wave device according to claim 3, wherein the via is directly connected to a pad electrode of a wiring layer provided between the substrate and the spacer layer.

18. The elastic wave device according to claim 3, wherein
the outer connection electrode is made of is made of nickel, gold, or an alloy of nickel or gold;
the via is made of nickel, copper, or an alloy of nickel or copper.

19. The elastic wave device according to claim 3, wherein the wiring layer is made of aluminum, copper, platinum, gold, silver, titanium, nickel, chromium, molybdenum, or tungsten; or an alloy having aluminum, copper, platinum, gold, silver, titanium, nickel, chromium, molybdenum, or tungsten as a main constituent.

* * * * *